350-96.15 SR
XR 3,876,900

United States Patent [19]

[11] 3,876,900
[45] Apr. 8, 1975

Amatsuka et al.

[54] ELECTRIC LIGHT-EMITTING APPARATUS

[75] Inventors: Yoshio Amatsuka; Kenichi Konishi, both of Kyoto, Japan

[73] Assignee: Matsushita Electronics Corporation, Kodama, Osaka Pref., Japan

[22] Filed: May 14, 1973

[21] Appl. No.: 360,059

[30] Foreign Application Priority Data
May 15, 1972 Japan ............ 47-48486

[52] U.S. Cl. ............ 313/510; 250/553
[51] Int. Cl. ............ G02f 1/28
[58] Field of Search ............ 313/108 D, 109.5, 210, 313/220, 113; 315/169 R; 250/552, 227, 553; 317/235 N; 240/41.35 F, 41.36, 41.35 D, 46.55

[56] References Cited
UNITED STATES PATENTS

| | | | |
|---|---|---|---|
| 3,174,144 | 3/1965 | O'Neill | 313/109.5 |
| 3,346,759 | 10/1967 | Hardwick | 313/109.5 |
| 3,409,770 | 11/1968 | Clapham | 313/109.5 |
| 3,443,140 | 5/1969 | Ing | 313/108 D |
| 3,555,335 | 1/1971 | Johnson | 313/109.5 |
| 3,739,217 | 6/1973 | Bergh | 317/235 N |
| 3,746,853 | 7/1973 | Kosman | 313/108 D |

*Primary Examiner*—James W. Lawrence
*Assistant Examiner*—D. C. Nelms
*Attorney, Agent, or Firm*—Wenderoth, Lind & Ponack

[57] ABSTRACT

This invention relates to an electric light-emitting apparatus, wherein electric light-emitting diodes are secured on the flat bottoms of recesses, which are formed on an electrically conductive substrate. The light-emitting diodes are contained in light-conducting wafers of transparent resin embedded in the recesses respectively. Each wafer has an oblique smooth reflection plane for reflecting the light conducted from the light-emitting diodes. A mask with light-diffusing regions and having a roughened lower face is provided to cover all the abovementioned parts in such a manner that the light-diffusing regions receive light from the smooth reflection planes, respectively.

7 Claims, 3 Drawing Figures

ELECTRIC LIGHT-EMITTING APPARATUS

BACKGROUND OF THE INVENTION

Hitherto, electric light-emitting apparatus have been produced comprising several electric light-emitting diodes embedded in or faced to respective light-conducting transparent resin wafers, whose edges are so arranged to indicate in alignment of a letter or a mark when lit. One example of such apparatus was shown, for instance, in the specification of the U.S. Pat. No. 3,555,335. In such prior art, due to its construction that the edges of the resin wafers were to be seen from the observer, the transparent resin wafer could not be arranged flatly on a supporting board, and moreover, the wire connection to the electrodes of the electric-lighting diodes was very complicated. Furthermore, there was a possibility that the light was liable to leak into adjoining resin wafers, causing unclear indication.

SUMMARY OF THE INVENTION

This invention eliminates the above-mentioned shortcomings of the conventional apparatus.

Accordingly, the present invention is intended to provide a compact electric light-emitting apparatus which is capable of clear indication and is constructed as flat as a printed circuit board. Also, this invention enables easy and precise mass-production of the clear-indicating electric light-emitting apparatus.

DETAILED DESCRIPTION OF THE INVENTION

Figures 1, 2, 3:
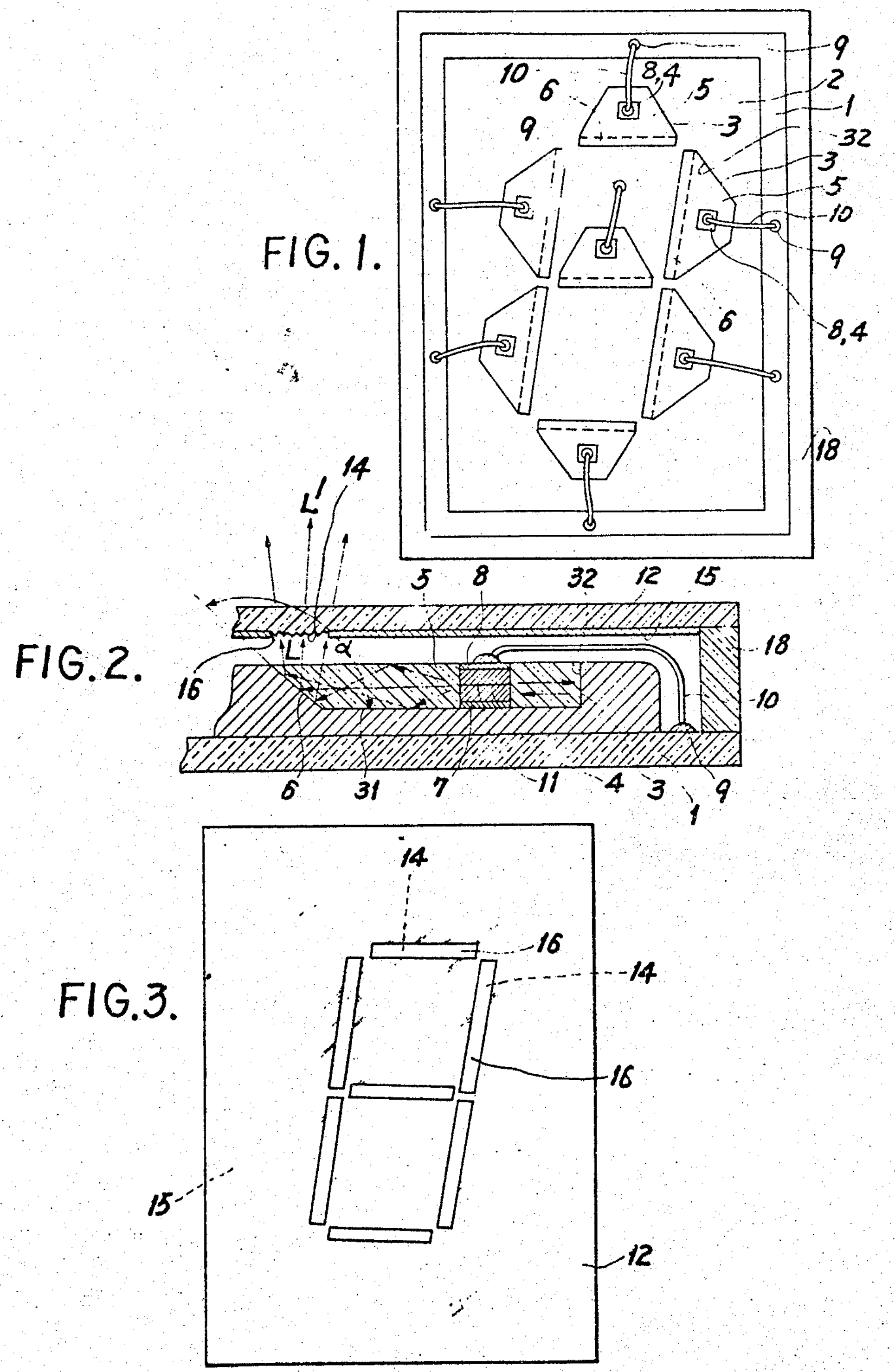
FIG. 1 is a plan view seen without a mask 12 of the apparatus of the present invention.
FIG. 2 is an enlarged sectional view of a part of the apparatus of FIG. 1.
FIG. 3 is a plan view of the mask 12.

In FIG. 1, on an insulating board substrate 1, an electrically conductive substrate 2, for instance, an aluminum substrate, is provided by bonding or the like. On the face of the aluminum substrate 2 several recesses 3 are formed in a specified pattern by, for instance, pressing. Each recess 3 has a smooth flat bottom 31, which is surrounded by smooth vertical side walls 32, and an oblique smooth reflection plane 6. In one example the aluminum substrate 2 is about 0.5 mm thick and each recess 3 is about 0.2 mm deep. In each recess, one electric light-emitting diode 4 comprising, for instance a, galliumphosphide (GaP) or a galliumarsenidephosphide(GaAsP) semiconductor with light-emitting P-N junction 11, approximately 0.4 mm by 0.4 mm (broad) by 0.2 mm(thick) in size, is bonded on the flate bottom 31 with its lower electrode bonded with a layer 7 of known electrically conductive bond. Also, a wafer 5, tightly contacting the inner faces of the recess 3 and made of light conductive transparent resin, is embedded in the recess 3, by pouring melt resin or unhardened resin in the recess 3, so that the transparent resin wafer 5 surrounds the light-emitting diode 4.

Thus, the wafer 5 of transparent resin (containing the light-emitting diode 4) forms a light guide, wherein the upper surface and bottom together form parallel surfaces for conducting the light by the "total reflection phenomenon" and the smooth vertical faces of the wafer 5, which are contacting the vertical walls 32 of the metal, constitute reflecting mirrors to conduct the light towards the oblique smooth reflection plane 6.

Said smooth reflection plane 6 is made very smooth and glossy so as to efficiently reflect the light, and forms obtuse angle $\alpha$ with the flat floor 31. An obtuse angle $\alpha$ of between 135° and 145° is experimentally found best for clear indication. For example, the smooth reflection plane 6 is formed to be a belt of 4 mm to 10 mm long by 2 mm wide.

Fine connecting wires of, for instance, aluminum or gold connect respective upper electrodes 8 of the light-emitting diodes 4 to the connecting tabs 9 on the insulating substrate 1.

The example of FIG. 1 is a seven-element apparatus for indicating numerals 0, 1, 2, 8, 9 for use, for instance, in a desk-top electronic calculator.

Then, a mask 12 is placed on the top of the conductive substrate 2, supported by a spacing and supporting means 18. The mask 12 is made of, for instance, a transparent plate having several bar-shaped light diffusing regions 16, which are arranged to face said smooth reflection planes 6 so as to receive the light therefrom, respectively.

Each light diffusing region 16 has a roughened lower face 14, so as to receive the light reflected from the smooth reflection plane 6 and to scatter or diffuse the light upwards. Such roughened face 14 is made by, for instance, cutting, scratching, sandblasting the surface, casting the resin with a model having a rough face, or by coating the face with translucent fine grains. The transparent plate of the mask 12 is of a resin having a color, for instance, red which can selectively pass the light of the light-emitting diodes to minimize unnecessary light reflections caused by lights from outside.

An opaque, light-shielding layer 15 is preferably provided to coat the parts other than the light-diffusing regions 16 of the mask 12, so as to shield unnecessary light reflections from connecting wires, connecting tabs or relevant printed circuits.

For a modified example, the aluminum substrate 2 with the recesses 3 bonded on the insulating board 1 can be replaced by an insulating board with recesses of similar shapes, a specified part of which board is coated with vapor-deposited aluminum layer.

For other modified examples, the recesses may be of other patterns than the abovementioned seven-element numeral indicating pattern, so as to indicate other kinds of letter or mark.

Since the electric light-emitting apparatus of the present invention is constituted as abovementioned, when selected light-emitting diodes 4 are lit, the light emitted from the respective P-N junctions 11 of the light-emitting diodes 4 are conducted by reflections at the vertical walls 32 and at both top and bottom faces of the transparent resin wafers 5 to the smooth reflection planes 6 and are reflected as shown by arrows L of FIG. 2, to pass through the roughened lower faces 14 of the mask 12. Thus, the lights emitted from very small areas as of the light-emitting diodes 4 illuminate the light diffusing regions 16 of desired lengths and widths, enabling clear indication of the letter or the mark. Since the light from the light-emitting diodes 4 are conducted through the thin transparent resin wafer 5 by the "total reflection phenomenon," the light does not leak outside except upwards from the reflection plane 6, enabling attainment of efficient light conduction and providing a clear indication to viewers.

Since the transparent resin wafers 5 containing the light-emitting diode 4 are laid flatly on the electrically conductive substrate, the apparatus has a very simple structure, thereby ensuring that it will be shock-proof thin and easy to produce.

Since the lower electrode of the light-emitting diode 4 is directly connected to the conductive substrate 2, it is only the upper electrode that must be wired and connected to the connecting tabs 9 on the insulating substrate 1. Thus, wiring of the apparatus can be simplified.

Since the roughened lower faces 14 emits the diffused light as secondary light sources, clear indication of a letter or mark can be attained by designing the light diffusing regions 16 so as to have sufficient width, and by arranging the light diffusing regions in such a manner that at the ends of bar-shaped light diffusing regions, unnecessary gaps between each other are reduced to a minimum.

Moreover, since the light is diffused from the mask face 12, there is no possibility of misreading the letter or mark indicated by the light-emission, even though the letter or mark is observed from a position in an oblique direction.

When the opaque layer 15 is provided, unnecessary parts, for instance, connecting wires 10, connecting tabs 9 or relevant printed circuits, are covered with the opaque layer 15, and therefore unnecessary reflections from these parts are eliminated, and a clear indication is obtained.

What is claimed is:

1. A light-emitting apparatus, comprising:

an electrically conductive substrate with a predetermined number of recesses each having a flat bottom, smooth vertical side walls and an oblique reflection plane of smooth surface, said oblique plane forming an obtuse angle with the flat bottom, an insulated substrate supporting said electrically conductive substrate;

a plurality of light-emitting diodes having two electrodes each, one said diode secured on the bottom of each of said recesses and one electrode thereof being electrically connected to said bottom;

a plurality of transparent light-conductive resin wafers, one said wafer tightly embedded in each of said recesses and surrounding said light-emitting diode to form a light reflecting face by which the light emitted from the light-emitting diode is reflected by "total reflection phenomenon" to radiate outwardly;

one wire connecting the other electrode of each of said light-emitting diodes to a connecting tab on said insulating substrate; and a mask having light-diffusing regions of roughened face and positioned to cover all the abovementioned parts, said light-diffusing regions being positioned over each light-conductive resin wafer with a predetermined gap therebetween such that said roughened faces of light-diffusing regions receive light from each said reflection plane, and further emit the light outwardly.

2. The apparatus of claim 1, wherein the conductive substrate is made of metal plate within which said recesses are formed.

3. The apparatus of claim 1, wherein a P-N junction of each light-emitting diode is arranged substantially parallel to the flat bottom of the recess.

4. The apparatus of claim 1, wherein said obtuse angle is between 135° and 145°.

5. The apparatus of claim 1, wherein the oblique reflection plane has larger area than the light-emitting area of the light-emitting diode.

6. The apparatus of claim 1, wherein the roughened face of the light-diffusing region is on the side of the mask facing the reflection plane of the transparent wafer.

7. An apparatus of claim 1, wherein the mask 12 is made of a transparent plate of a color to selectively pass the light from each said light-emitting diode.

* * * * *